(12) United States Patent
Van Zeghbroeck

(10) Patent No.: US 7,498,651 B2
(45) Date of Patent: Mar. 3, 2009

(54) JUNCTION TERMINATION STRUCTURES FOR WIDE-BANDGAP POWER DEVICES

(75) Inventor: Bart Van Zeghbroeck, Boulder, CO (US)

(73) Assignee: Microsemi Corporation, Bend, OR (US)

( * ) Notice: Subject to any disclaimer, the term of this patent is extended or adjusted under 35 U.S.C. 154(b) by 300 days.

(21) Appl. No.: 11/286,144

(22) Filed: Nov. 23, 2005

(65) Prior Publication Data

US 2006/0118900 A1   Jun. 8, 2006

Related U.S. Application Data

(60) Provisional application No. 60/631,024, filed on Nov. 24, 2004.

(51) Int. Cl.
*H01L 29/93* (2006.01)
(52) U.S. Cl. .................. 257/483; 257/484; 257/489
(58) Field of Classification Search ............. 438/140; 257/483, 127
See application file for complete search history.

(56) References Cited

U.S. PATENT DOCUMENTS 3,890,698 A * 6/1975 Clark .................. 438/384
4,157,563 A * 6/1979 Bosselaar ............. 257/489
4,947,232 A * 8/1990 Ashida et al. .......... 257/336
5,382,826 A * 1/1995 Mojaradi et al. ........ 257/489
5,498,899 A * 3/1996 Palara ................ 257/536
5,541,439 A * 7/1996 Mojaradi et al. ........ 257/488
5,914,499 A   6/1999 Hermansson et al.
6,262,454 B1   7/2001 Legnani et al.
6,680,515 B1 * 1/2004 Hsing ................ 257/409
6,844,251 B2   1/2005 Shenai et al.
6,879,005 B2 * 4/2005 Yamaguchi et al. ...... 257/367
7,183,626 B2 * 2/2007 Ranjan ............... 257/537
2005/0189603 A1* 9/2005 Inao et al. ............ 257/495

* cited by examiner

*Primary Examiner*—N Drew Richards
*Assistant Examiner*—Ankush K Singal
(74) *Attorney, Agent, or Firm*—Marger Johnson & McCollom, P.C.

(57) ABSTRACT

Disclosed are a variety of junction termination structures for high voltage semiconductor power devices. The structures are specifically aimed at providing a high breakdown voltage while being constructed with a minimal number of process steps. The combination of an RIE etch and/or implantation and anneal process with a finely patterned mesh provides the desired radial gradient for maximum breakdown voltage. The structures provide control of both the conductivity and charge density within the region. These structures can beneficially be applied to all high voltage semiconductor device structures, but are of particular interest for wide bandgap devices as they tend to have very high breakdown fields and scaled dimensions of the depletion layer width.

2 Claims, 3 Drawing Sheets

JUNCTION TERMINATION STRUCTURES FOR WIDE-BANDGAP POWER DEVICES

RELATED APPLICATION DATA

This application claims priority from U.S. provisional application Ser. No. 60/631,024, filed Nov. 24, 2004, incorporated by reference herein.

STATEMENT REGARDING FEDERALLY SPONSORED RESEARCH OR DEVELOPMENT

This invention was made under National Institute of Standards and Technology, Advanced Technology Programs, U.S. Department of Commerce Cooperative Agreement No. 70NANB 3H3016. The United States Government has certain rights in this invention.

BACKGROUND OF THE INVENTION

This invention relates to junction termination structures in high voltage power semiconductor devices and more particularly to junction termination structures for wide bandgap power devices, such as silicon carbide, gallium nitride, gallium aluminum nitride, gallium indium nitride, diamond devices, and the like.

Junction termination structures are a common feature of most high voltage power switching devices, such as p-n diodes or Schottky diodes, and bipolar transistors, thyristors, power MOSFETs and IGBTs, which intrinsically include one or more p-n diodes. The intent of these structures is to reduce high electric fields at the edge of the device, resulting in higher blocking voltages.

A standard approach is to add a junction termination structure that reduces the high field at the edges by providing additional charges on which the field lines terminate. This charge is typically obtained by implanting dopants of appropriate polarity in a concentric region around the junction area, which fully depletes as a high voltage is applied across the diode. Up to three such implants are typically used, with different doses to further reduce the field spikes at the transition between each region. Alternatively, one can implant a set of concentric rings, called guard rings, that provide a similar function. Yet another approach is to etch a doped region to a thickness that provides the desired dose. Both step-like concentric regions and concentric rings can be etched this way as an alternate approach to the ion implanted structures.

Termination structures have been used for a variety of devices such as p-n diodes, Schottky diodes and bipolar transistors. A typical vertical structure of these devices and the location of the termination structure are illustrated with FIGS. 1A, 1B and 1C. Note that in these constructions, the unetched portions of the termination structure has a dopant polarity opposite to that of the substrate.

Prior art includes both ion implanted as well as etched structure with concentric regions with variable thickness or dose and concentric rings. An example of a three section etched termination structure is shown in FIGS. 2A and 2B, and an example of an etched termination with concentric rings is shown in FIGS. 2C and 2D. Unlike the structures shown schematically in the figures, the layered structures in FIGS. 2A and 2B can have variable etch depth and spacing and concentric ring structure in FIGS. 2C and 2D can have variable width in the unetched portions as well as in the spacing.

All these approaches would benefit from a larger number of regions with different dose or, better yet, a controlled taper, which is quite complex and more difficult to control.

SUMMARY OF THE INVENTION

The present invention is a novel type of termination structure and method of making, which provides a high blocking voltage while being fabricated with a simple controllable process. Features of the invention include the use of a finely patterned structure that provides the desired lateral taper and the combination of resistive and/or capacitive sections that stabilize the electric fields even in the presence of defects or local breakdown. While a typical edge termination structure has a width larger than the depletion layer width in the semiconductor, the finely patterned structure can have features that are much smaller than the width of the depletion region.

An embodiment of the invention is a junction termination structure for a high voltage semiconductor power device formed on a substrate, the junction termination structure comprising a first conductive termination ring surrounding the device and spaced laterally from a peripheral edge of the device; a second conductive termination ring spaced laterally outward from the first conductive ring; and a resistive interconnection between the peripheral edge of the device and at least one of the first and second conductive rings.

Each of the conductive rings can be patterned in a conductive layer atop the substrate with gaps between the device edges and the rings defining the lateral spacing therebetween. The resistive interconnections can be formed by partially etching a conductive layer, leaving a thin conductive layer with high sheet resistance.

Alternatively, both the conductive rings and resistive interconnections can be ion implanted into the substrate, with a much higher dose for the conductive rings and a lower dose for the resistive interconnections. A combination of both techniques can be used as well, for instance a combination of conductive rings patterned in a conductive layer atop the substrate with ion implanted resistive interconnects with higher sheet resistance.

A method of making a high voltage power semiconductor device with a junction termination structure comprises forming a high voltage power semiconductor device on a region of a substrate, the device having a peripheral edge; forming a resistive region around the device, adjoining the peripheral edge thereof and extending outward a predetermined distance from the edge; and forming a plurality of conductive arms connected electrically to the peripheral edge around the device and extending outward over the resistive region. One or more conductive rings around the device can be spaced from the peripheral edge and connected to the device by the connecting arms. The connecting arms can be patterned to form segments of a spiral.

This type of termination structure can be used in high voltage diodes but also in other high voltage devices that contain diodes including bipolar junction transistors and thyristors, power MOSFETs and IGBTs. It is particularly adapted to the fabrication of semiconductor power devices, such as power devices including p-n diodes, Schottky diodes, high voltage MOSFETs and bipolar junction transistors in wide bandgap semiconductor materials including silicon carbide. Applications of such devices include power switching, power conditioning, power converting and power transmission applications.

The foregoing and other objects, features and advantages of the invention will become more readily apparent from the following detailed description of a preferred embodiment of the invention that proceeds with reference to the accompanying drawings.

DETAILED DESCRIPTION

A junction termination structure for a high voltage semiconductor power device according to various embodiments of the invention comprises a finely patterned structure with different implant doses or different etch depths, that reduce the high field regions in the structure. This approach is increasingly effective as the finely patterned structure can have a minimum feature size that is distinctly smaller than the depletion layer width of the device. An added feature is the use of highly resistive links between concentric rings, potentially combined with regions that cannot be fully depleted and regions that are always depleted. Typical dimensions for SiC blocking layers are 10-micron depletion layers for 1000V blocking voltage, while the edge termination structure would be multiple times the depletion layer width, namely 30 to 100 micron. Structures with higher blocking voltage have larger depletion layers and also larger edge terminations. The desired minimum feature size is therefore on the order of a few microns or less.

The combination of regions with high resistivity, low resistivity, fully depleted and partially depleted with a fine patterned mesh provides the flexibility to optimize the junction termination structure, while using a limited number of process steps.

Figure 3A:
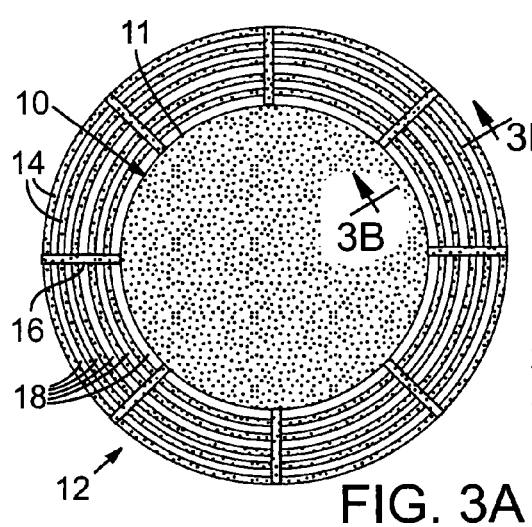
FIGS. 3A and 3C are top plan views of two variations of an edge termination structure with concentric rings and radial resistive connections according to the invention.
Figure 3C:
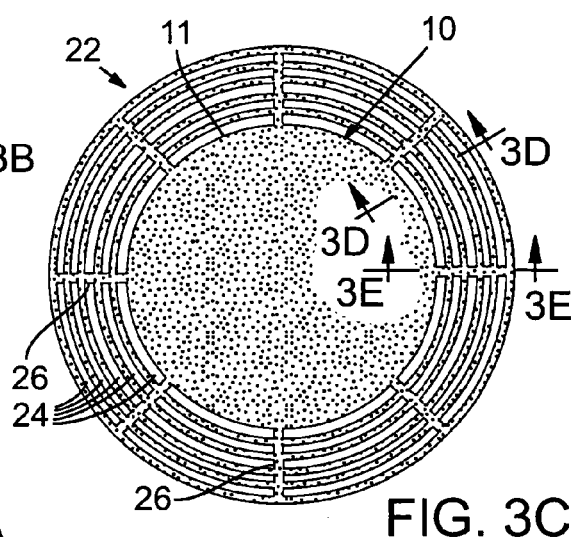
Figure 3B:
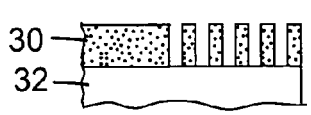
FIGS. 3B, 3D and 3E are partial cross-sectional views taken respectively along lines 3B-3B in FIG. 3A and lines 3D-3D and 3E-3E in FIG. 3C.
Figure 3D:
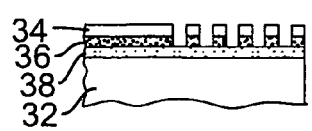
Figure 3E:
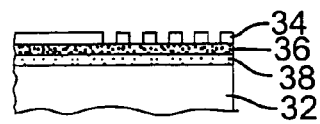

A first type of structure is a power device 10 with a junction termination structure 12 consisting of concentric rings 14 with resistive connections 16 spanning the gaps 18 between device edge 11 and each of the rings as shown in FIGS. 3A and 3B. An alternate junction termination structure 22 contains partially etched regions defining the shorting bars 26 between the rings 24 as shown in FIGS. 3B, 3D and 3E. These regions deplete if the local electric field is high, thereby facilitating the termination of the electric field lines without creating field spikes.

Figure 1A:
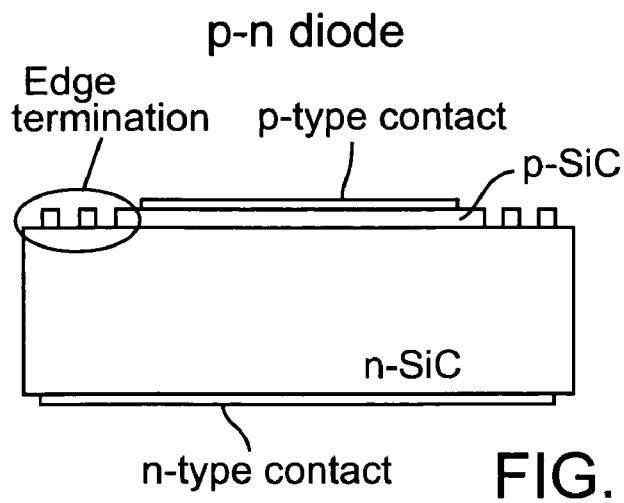
FIGS. 1A and 1B are cross-sectional views of a p-n diode and a Schottky diode respectively with a conventional edge termination structure.
Figure 1B:
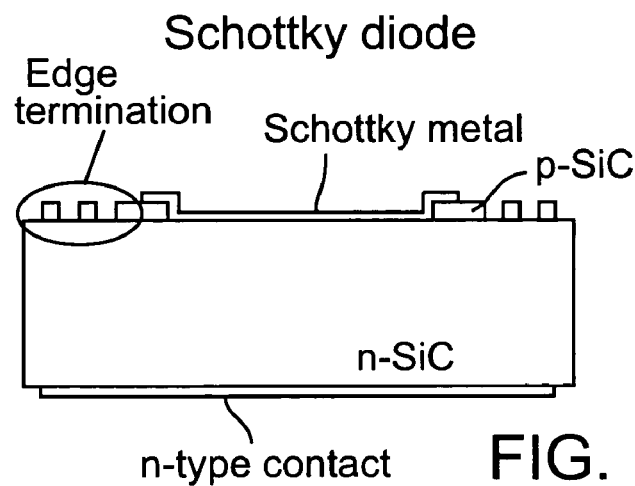
Figure 1C:
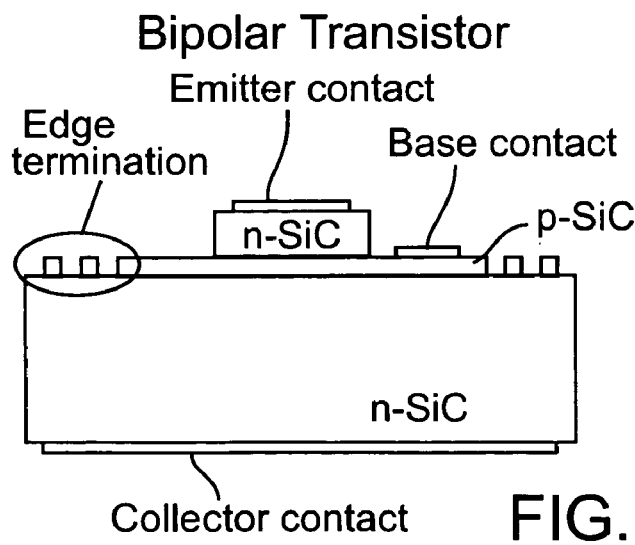
FIG. 1C is a cross-sectional view of a bipolar transistor with a conventional edge termination structure.
Figure 2A:
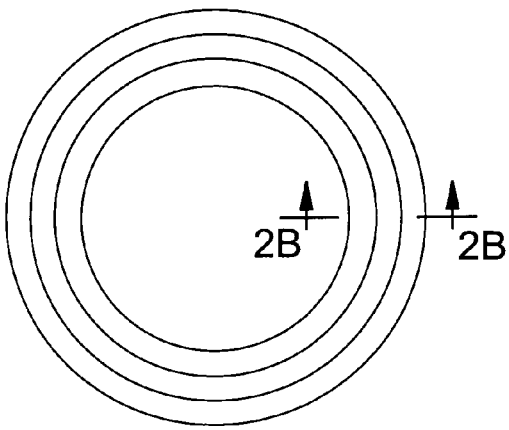
FIG. 2A is a top view and FIG. 2B is a cross-sectional view of a conventional etched three section edge termination structure.
Figure 2B:
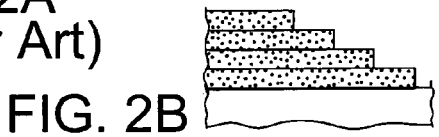
Figure 2C:
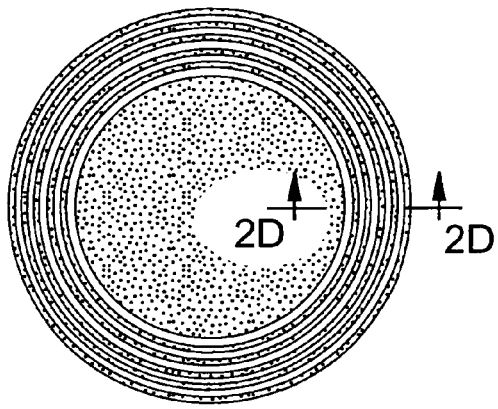
FIG. 2C is a top view and FIG. 2D is a cross-sectional view of a conventional etched edge termination structure with concentric rings, also called guard rings.
Figure 2D:
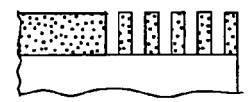

In these and subsequent figures, the power device 10 is shown only generally and can be any of the types of devices shown in FIGS. 1A, 1B or 1C, or others as mentioned above. The device, rings and shorting bars are formed by one or more semiconductor layers, such as doped epitaxial, silicon carbide, patterned by etching to form the device edge, the rings and gaps therebetween, and the shorting bars. In the embodiment of FIGS. 3A and 3B, a single doped layer 30 is shown on substrate 32. A single etch can suffice to pattern the device edge and junction termination structures to a single depth, fully etching down to the substrate.

In the embodiment of FIGS. 3C, 3D and 3E, three layers 34, 36, 38 are shown. Multiple etching steps can be used to form the rings and shorting bars to different depths and thereby different resistances. The conductance of the shorting bars can thereby be less than that of the rings even though formed of the same conductivity material. Also, the conductivities of the layers can be different, for example, the lower layer 38 having a lower conductivity than the upper layer or layers 34, 36, providing another dimension of control in patterning the junction termination structure.

A further dimension of control can be provided by varying the widths of the rings and gaps, and the width and length of the shorting bars across the gaps.

Since the concentric rings are connected, they would all be at the same potential if no current flows. However, by using high resistive layers, the potential would depend on the ratio of the resistive mesh and the leakage current through the substrate. Since the leakage current rapidly increases with potential across the depletion regions, the current and voltage would naturally evolve until the potential variation is minimized at all locations. The least resistive path dominates the voltage division and other regions naturally follow this predominant pattern.

A further addition is to connect the outer ring to the substrate. This results in an additional current through the resistive network even in the absence of any leakage current. The advantage is that the potential will be spread out, even in the absence of any leakage current, and that any dynamics due to local breakdown can be minimized.

Through design of these different elements one expects to further optimize the structure and maximize the breakdown voltage.

Figure 4A:
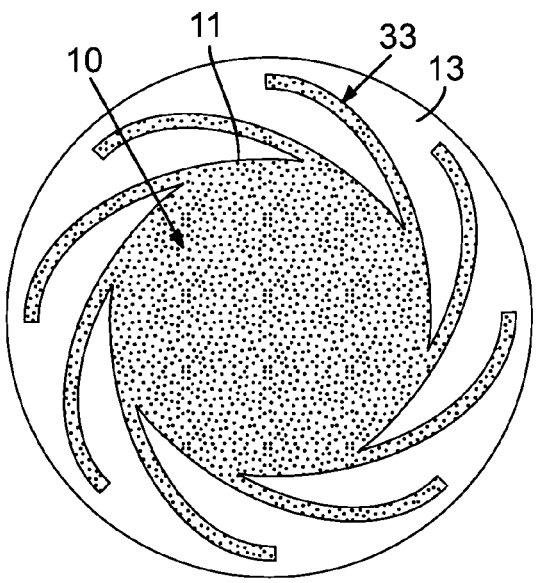
FIGS. 4A and 4B are top plan views of two variations of structures with spiraling resistive connections.

Another set of junction termination structures 33, 42 contains spiraling resistive connections. Examples are shown in FIG. 4A, which can be formed in a single layer as in FIG. 3B, and in FIG. 4B, which can be formed in multiple layers as in FIGS. 3D and 3E. This approach provides a higher resistance for the same sheet resistance. These structures allow taking advantage of the layers that are already part of the device even if their sheet resistance is lower than desired, so that one can still pattern the device layer and the resistive spiral with the same process step.

Figure 4B:
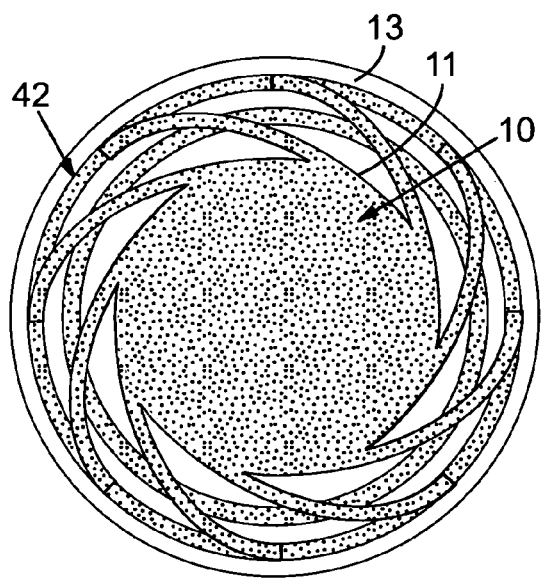

The structure shown in FIG. 4A contains spiraling resistive connections 33, which are connected to the device in the center, so that by varying the width and length the optimum resistance can be obtained. The spiraling shorts are formed by partially etching through the top conducting layer, thereby leaving a thin and low-doped region 13 with high sheet resistance underneath the spirals. Region 13 can be a low-doped exitaxial layer formed over the substrate. FIG. 4B contains a combination of concentric rings 42 with spiraling resistive connections formed over region 13. Selecting the width and length of the spiraling shorts between the concentric rings, results in a resistive short with the desired resistance independent of the sheet resistance of the top layer 10.

Figure 5A:
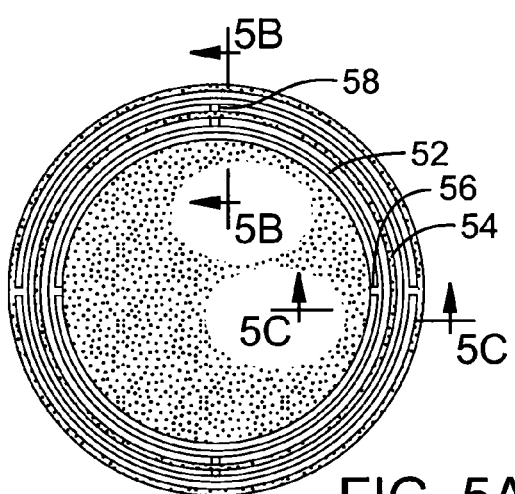
FIG. 5A is a top view and FIGS. 5B and 5C are cross-sectional views of a structure with alternating conducting and resistive rings.
Figure 6A:
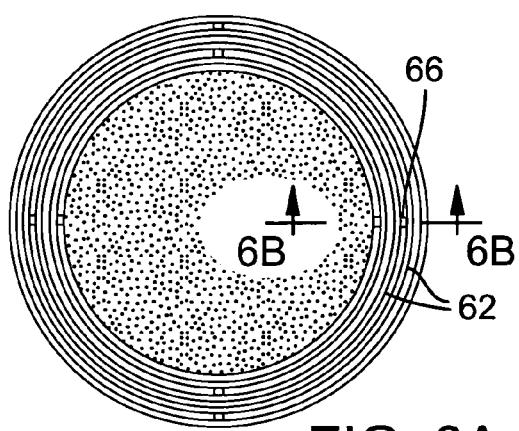
FIG. 6A is a top view and FIG. 6B is a cross-sectional view of a structure with alternating connected resistive rings.
Figure 5C:
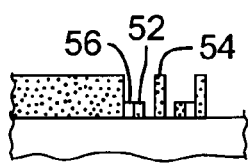
Figure 5B:
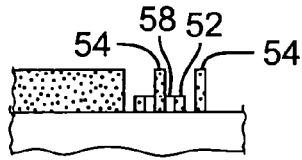
Figure 6B:
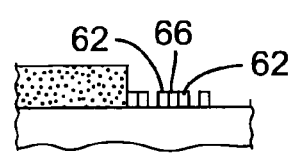

Further structures include resistive rings that are connected such that any current would have to flow along a portion of the ring, thereby providing the desired high resistance. Two examples are shown in FIGS. 5A, 5B, 5C and FIGS. 6A and 6B. FIG. 5A contains a structure with alternating resistive rings 52 and conducting rings 54; formed in one or more layers etched to different depths. Shorting bars 56 connects one pair of rings while a quadrant away another shorting bar 58 connects the next pair of rings. FIG. 6A shows a structure with resistive rings 62 only, attached by resistive bars 66 at alternating points on the ring, resulting in maximum resistance between the inner and outer rings. All doped layers in the structure provide a dual function since they provide a conductive path between the device and different parts of the termination structure and can be partially or even fully depleted as a high voltage is applied across the device. The depleted region contains charges on which the electric field lines terminate. Proper design of the location and quantity of these charges allows for a gradual taper of the electric field from its highest value at the edge of the device to its lowest value at the outer edge of the edge termination structure. The choice of using a finely patterned termination structure as claimed provides effectively a gradual variation of both the resistive connections and the charges in the depleted regions of the edge termination structure. This gradual variation is obtained by gradually varying the lateral width and length of the patterned features so that they can be formed with a single etch step.

ALTERNATE STRUCTURES

While all drawings assume an etched termination structure, the equivalent structure can also be implemented with ion implantation or epitaxial regrowth. Additional structures can be deposited on top of the termination structure, such as insulators to avoid surface breakdown, overgrown undoped silicon carbide, and/or field plates to control the field distribution. The semiconductor can be any semiconductor including GaN, GaAlN, GaInN, Diamond and other SiC polytypes as well as a mix of these and other materials. The surfaces can further be passivated, for instance, with a thermal oxide or nitride passivation layer. The device shapes can also be other than circular, including oval or rectangular with rounded corners. Sharp corners should be avoided because of the high local fields at the edges.

Having described and illustrated the principles of the invention in various embodiments thereof, it should be apparent that the invention can be modified in arrangement and detail without departing from such principles. All modifications and variations come within the spirit and scope of the following claims.

The invention claimed is:

1. A method of making a high voltage power semiconductor device with a junction termination structure, comprising:
    forming a high voltage power semiconductor device on a region of a substrate, the device having a peripheral edge;
    forming at least first and second conductive rings around the device, the first ring spaced from the peripheral edge and the second ring spaced from the first ring; and
    forming a resistive interconnection between the peripheral edge of the device and at least the first ring, the resistive interconnection being formed so as to provide an electrical path which stabilizes the voltages at each of the conductive rings and to provide a doped region that can be partially or completely depleted so that the electric field lines can be terminated on the charge in the depleted doped region;
    the foregoing forming steps including:
    depositing a doped semiconductive layer of a first thickness on the substrate;
    forming the device in or on the doped semiconductor layer within the region of the substrate; and
    etching a pattern in the doped semiconductor layer to define the peripheral edge of the device, and at least first and second rings spaced therefrom;
    wherein the etching step etches entirely through the doped semiconductor layer in at least one gap between the device, the first ring and the second ring.

2. A method of making a high voltage power semiconductor device with a junction termination structure, comprising:
    forming a high voltage power semiconductor device on a region of a substrate, the device having a peripheral edge;
    forming at least first and second conductive rings around the device, the first ring spaced from the peripheral edge and the second ring spaced from the first ring; and
    forming a resistive interconnection between the peripheral edge of the device and at least the first ring, the resistive interconnection being formed so as to provide an electrical path which stabilizes the voltages at each of the conductive rings and to provide a doped region that can be partially or completely depleted so that the electric field lines can be terminated on the charge in the depleted doped region;
    the foregoing forming steps including:
    depositing a doped semiconductive layer of a first thickness on the substrate;
    forming the device in or on the doped semiconductor layer within the region of the substrate; and
    etching a pattern in the doped semiconductor layer to define the peripheral edge of the device, and at least first and second rings spaced therefrom;
    wherein the etching step etches partially through the doped semiconductor layer in at least one gap between the device, the first ring and the second ring.

* * * * *